United States Patent [19]

Chandler et al.

[11] Patent Number: 5,132,874
[45] Date of Patent: Jul. 21, 1992

[54] THERMO-SWITCH APPARATUS

[75] Inventors: Kirk R. Chandler, Garland; Larry D. McPherson, Allen, both of Tex.

[73] Assignee: Alcatel Network Systems, Inc., Richardson, Tex.

[21] Appl. No.: 770,821

[22] Filed: Oct. 4, 1991

[51] Int. Cl.⁵ .............................................. H05K 7/20
[52] U.S. Cl. .................................. 361/386; 219/210; 361/383; 361/388
[58] Field of Search ............... 219/209, 210; 361/380, 361/346, 383, 386–391

[56] References Cited

U.S. PATENT DOCUMENTS

| | | | |
|---|---|---|---|
| 3,617,692 | 11/1971 | Landis | 219/210 |
| 4,684,783 | 8/1987 | Gore | 219/210 |
| 4,920,574 | 4/1990 | Yamamoto | 361/385 |

*Primary Examiner*—Gregory D. Thompson
*Attorney, Agent, or Firm*—Bruce C. Lutz; Dennis O. Kraft

[57] ABSTRACT

A method is shown, along with apparatus for accomplishing same, for minimizing power required to keep an enclosed electronic module from overheating in a high temperature environment, while still operating to maintain the module at greater than a given minimum temperature when the environmental temperatures are far below the sensed minimum temperature for the module. This is accomplished by placing a thin sheet of heating material between the module to be temperature maintained and a heat sink which is exposed to the environment exterior the enclosure. Energy applied to the sandwiched heater prevents transfer of heat from the electronic module to the environment in such a way as to drastically reduce the heat (power consuming) requirements as compared to prior art heater approaches.

5 Claims, 1 Drawing Sheet

THERMO-SWITCH APPARATUS

THE INVENTION

The present invention generally relates to electronics and more specifically to a method of reducing the energy requirements for maintaining an enclosed electronics module at a given temperature at cold extremes while still preventing overheating of the electronics module in high temperature environmental extremes.

BACKGROUND

In the prior art heaters are commonly used in an enclosed area or container to control only the temperature of a given object or device by controlling the temperature around it or by controlling the surface or case temperature of an object or device. Thus, prior art heaters typically are inserted in an enclosure or box along with the device to be temperature maintained. If the box is subjected not only to environmentally low temperatures but additionally to environmentally high temperatures where the electronics in the enclosure could overheat, a heat sink needs to be added to dissipate the heat from the electronics package under the high temperature conditions of the environment. When a heat sink is added to the package or electronics module being heated or cooled, it is much more efficient at dissipating heat therefrom under the environmentally cold conditions and thus, it is harder to maintain the module at a "safe" temperature under these conditions. Therefore, a much larger heater needs to be installed in such a container when the enclosure is subjected to both very high and low temperature conditions. The additional heat requirements of such a situation not only greatly tax a power source but can, in some instances, provide so much heat wherein the environment is very cold that electronic components immediately adjacent the heater may be damaged.

The present invention attempts to overcome the above disadvantages by inserting a heater between the package to be heated and the heat sink so as to prevent heat transfer therebetween on the thermo-dynamics principle that heat is never transferred from a cool object (electronics package) to a higher temperature object (heating element). Thus, as long as the heating element is heated to a temperature just slightly higher than the temperature of the electronics module, no heat will be dissipated from the electronics module to the outside environment through the heat sink so matter how cold the outside environment is. Since no heat is being drained off the electronics module, the module can, in most cases, maintain a desired temperature in the closed container due to its own power dissipation therein. The heater will, of course, supply some heat to the electronics module to help keep the internal temperature in the container at the desired value. It is realized that heat will be dissipated from the heater to the heat dissipating surface of the cooling fins but it has been found that this heat dissipation is minimal as compared to the amount of heat dissipation occurring (and power required) if the heater were not interspersed between the electronic module and the cooling fins.

It is therefore an object of the present invention to provide an improved and more power efficient method of maintaining the temperature of an electronics module contained in an environmentally protective enclosure under cold extremes while not interfering with the dissipation of heat from the electronics module under environmentally high temperature extremes.

Other objects and advantages of the present invention will be apparent from a reading of the specification and appended claims in conjunction with the drawings wherein:

FIG. 1 is an exploded view of the inventive concept along with an appropriate enclosure; and FIG. 2 is a cross-sectional view of the electronics module of FIG. 1, as defined by lines 2—2 therein, mounted to a set of cooling fins with the heater in place therebetween.

DETAILED DESCRIPTION

Figure 1:
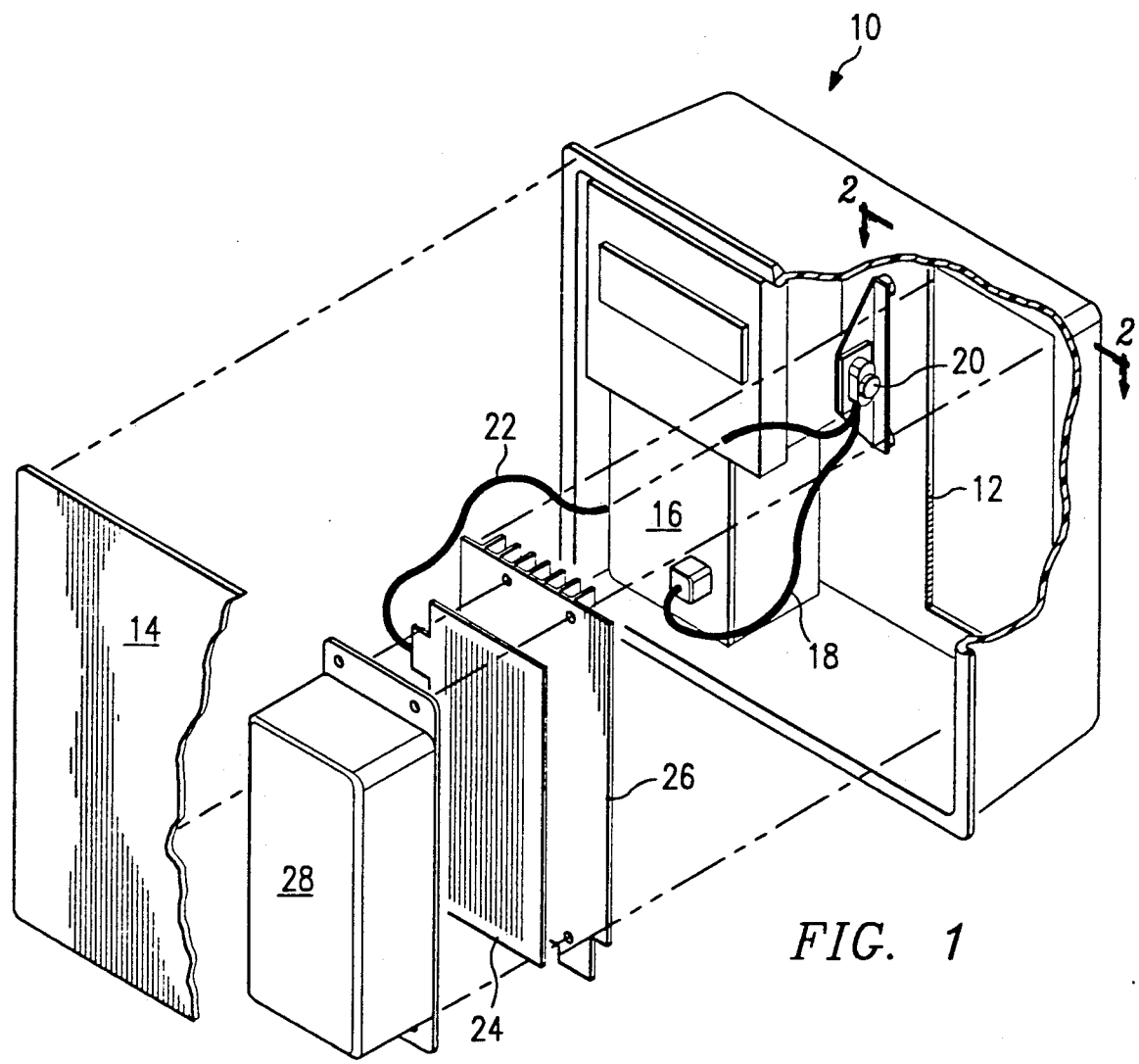

In FIG. 1 a container base 10 is shown with an opening 12 in the back and with a frontal enclosing surface 14. The cover 14 provides a complete enclosure to box or enclosure base 10. Within base 10 there will be found a battery pack generally designated as 16 with a lead or cable 18 emanating from battery pack 16 and passing through a temperature sensing device or thermostat 20. After exiting from thermostat 20, the cable is continued with a designation of 22 to a heater element 24. As will be seen, the heater element 24 is a thin sheet sandwiched between a set of cooling fins and associated base or support assembly 26 and an electronic module 28. In one embodiment of the invention the heating element 24 was only 0.007 inches in thickness. Openings are shown in both of the module 28 and the cooling fins 22 to be used for attaching the combination to the back plate or walls of the enclosure 10. As illustrated, the fins of heat exchanger or cooling element assembly 26 extend through the opening in the back of enclosure 10.

Figure 2:
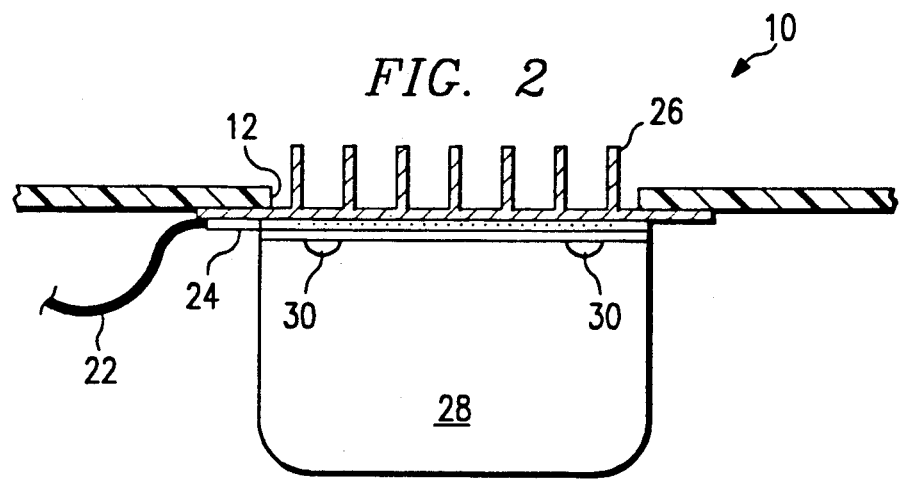

FIG. 2 uses the same numerical designations as used in FIG. 1 with the addition of fasteners designated as 30 to provide the attachment to the surfaces of the container 10 as shown.

OPERATION

The operation of the present inventive concept is reasonably apparent from the information provided above but a brief explanation will still be provided. The thermostat 20 is merely an ON/OFF device which allows passage of current from the battery 16 to the heater 24 when the temperature in the interior of enclosure 10 and 14 falls below a predetermined amount. Up to that time, any heat generated by any electronics within module 28 is conducted through the heating element 24 to the cooling fins assembly 26 and is dissipated to the environment. As an example, the environmental temperatures may vary from less than zero degrees C. to greater than 50 degrees C. The thermostat 20 may be set to activate the heater whenever the temperature within the container 10 falls to less than 10 degrees C. With the heater 24 activated to a temperature higher than the temperature of the electronics within module 28, there is no heat transfer from module 28 to the environment. The heater 24 will be maintained in an ON condition as long as the temperature within enclosure 10 stays less than the previously indicated temperature of 10 degrees that is to be maintained. When the temperature of the environment rises such that the temperature within container 10 is greater than 10 degrees, the heater 24 is turned to an OFF condition due to the thermostat 20 preventing passage of current and the heat generated within module 24 can be conducted directly to the environment by the cooling fins assembly 26. Although the heater does provide a slight impediment to the transfer of heat between 28 and 26, such impediment is substantially negligible in tests performed to date. Thus, as long as the environment is at a lower temperature (i.e., 50 degrees C.) than the temperature of the module 28, it will continue to dissipate heat to the environment.

As will be understood by those skilled in the art, if temperatures are much lower than zero degrees, the container 10 may be made of insulative material to prevent loss of heat at any point other than the cooling fins assembly 26. If the temperature of the environment normally is very high, and it is more of a problem to keep the electronics cool than to keep the electronics warm. Under these conditions, the container may be made of a heat dissipating material such as metal. The concept will still operate since the device to be kept at a substantially constant temperature (the electronic module 28) would still not be directly subjected to the environmental temperatures due to the intervention of the heating element 24 preventing direct heat transfer and thereby allowing the components within 28 to be fairly uniformly maintained at a temperature high enough to provide reliable operation.

Although we have shown one embodiment of the inventive concept, we wish to be limited not by the specific example reduced to practice and illustrated but only by the scope of the claims wherein we claim:

1. The method for regulating the temperature of electronic circuitry in an enclosure wherein the circuitry utilizes cooling fins on a surface of the enclosure for heat dissipation comprising the steps of:
    installing electronic circuitry in an enclosure for providing environmental protection to said circuitry;
    juxtaposing a thermostatically controlled heater between said electronic circuitry and cooling fins, in a thermal manner where said cooling fins dissipate heat to the environment from said circuitry when said heater is OFF: and
    energizing said heater whenever the temperature within said enclosure drops below a predetermined value.

2. Heat dissipation apparatus comprising, in combination:
    an enclosure;
    electronic circuit apparatus mounted in said enclosure;
    heat dissipation means mounted on a surface of said enclosure for exchanging heat with the environment exterior to said enclosure; and
    thermostatically controlled heating element means, thermally juxtaposed said electronic circuit apparatus and said heat dissipation means, for controlling when heat is transferred from said circuit apparatus to said heat dissipation means.

3. Heat dissipation apparatus comprising, in combination:
    an enclosure;
    electronic circuit apparatus mounted in said enclosure;
    heat dissipation means mounted on a surface of said enclosure for exchanging heat with the environment exterior to said enclosure; and
    controlled heating element means, situated between said electronic circuit apparatus and said heat dissipation means, in a manner for ensuring heat transfer from said circuit apparatus to said heat dissipation means when said heating element means is not energized and for controllably preventing the transfer of heat from said circuit apparatus to said heat dissipation means when said heating element means is energized.

4. Thermal switch apparatus comprising, in combination:
    electronic circuit apparatus mounted in an environmentally protective enclosure;
    heat dissipation means mounted on a surface of said enclosure for exchanging heat with the environment exterior to said enclosure; and
    heating element means, thermally contiguous both, and between, said electronic circuit apparatus and said heat dissipation means, for controllably preventing the transfer of heat from said circuit apparatus to said heat dissipation means when the temperature within said enclosure falls below a predetermined value.

5. The method of controlling the temperature of enclosed electronic circuitry comprising the steps of:
    situating circuitry to be thermally controlled in an enclosure;
    attaching heat dissipation means to said enclosure, for exchanging heat with the environment exterior to said enclosure;
    inserting a thin heating element between said circuitry and said heat dissipation means, said heating element being thermally contiguous said circuitry and said heat dissipation means;
    monitoring the temperature of said circuit relative a predetermined reference; and
    activating said heating element whenever the temperature of said circuitry is less than said predetermined reference.

* * * * *